US00RE48202E

(19) United States
(12) Reissued Patent
Lankhorst et al.

(10) Patent Number: US RE48,202 E
(45) Date of Reissued Patent: *Sep. 8, 2020

(54) ELECTRIC DEVICE COMPRISING PHASE CHANGE MATERIAL

(71) Applicant: III Holdings 6, LLC, Wilmington, DE (US)

(72) Inventors: Martijn Henri Richard Lankhorst, Eindhoven (NL); Liesbeth Van Pieterson, Eindhoven (NL); Robertus Adrianus Maria Wolters, Eindhoven (NL); Erwin Rinaldo Meinders, Eindhoven (NL)

(73) Assignee: III Holdings 6, LLC, Wilmington, DE (US)

( * ) Notice: This patent is subject to a terminal disclaimer.

(21) Appl. No.: 15/210,771

(22) Filed: Jul. 14, 2016

Related U.S. Patent Documents

Reissue of:
(64) Patent No.: 8,779,474
Issued: Jul. 15, 2014
Appl. No.: 10/539,251
PCT Filed: Dec. 3, 2003
PCT No.: PCT/IB03/05648
§ 371 (c)(1),
(2) Date: Jun. 15, 2005
PCT Pub. No.: WO2004/057684
PCT Pub. Date: Jul. 8, 2004

(30) Foreign Application Priority Data

Dec. 19, 2002 (EP) ..... 02080430.8
Mar. 7, 2003 (EP) ..... 03100583.8

(51) Int. Cl.
*H01L 29/76* (2006.01)
*H01L 45/00* (2006.01)
*H01L 27/24* (2006.01)

(52) U.S. Cl.
CPC ..... *H01L 45/06* (2013.01); *H01L 27/2436* (2013.01); *H01L 45/122* (2013.01);
(Continued)

(58) Field of Classification Search
None
See application file for complete search history.

(56) References Cited

U.S. PATENT DOCUMENTS 5,714,768 A 2/1998 Wicker et al.
5,825,046 A * 10/1998 Czubatyj et al. ..... 257/2
(Continued)

FOREIGN PATENT DOCUMENTS

EP 0 387 898 A2 9/1990
EP 0 495 494 7/1992
(Continued)

OTHER PUBLICATIONS

Borg, H.J., et al., "Phase-Change Media for High-Numerical-Aperture and Blue-Wavelength Recording," Japanese Journal of Applied Physics 40(Part 1, No. 3B):1592-1597, Mar. 2001.
(Continued)

*Primary Examiner* — Sean E Vincent
(74) *Attorney, Agent, or Firm* — Brinks Gilson & Lione

(57) ABSTRACT

The electric device (1, 100) has a body (2, 101) with a resistor (7, 250) comprising a phase change material being changeable between a first phase and a second phase. The resistor (7, 250) has an electric resistance which depends on whether the phase change material is in the first phase or the second phase. The resistor (7, 250) is able to conduct a current for enabling a transition from the first phase to the second phase. The phase change material is a fast growth material which may be a composition of formula $Sb_{1-c}M_c$ with c satisfying $0.05 \leq c \leq 0.61$, and M being one or more elements selected from the group of Ge, In, Ag, Ga, Te, Zn
(Continued)

and Sn, or a composition of formula $Sb_aTe_bX_{100-(a+b)}$ with a, b and 100−(a+b) denoting atomic percentages satisfying 1≤a/b≤8 and 4≤100−(a+b)≤22, and X being one or more elements selected from Ge, In, Ag, Ga and Zn.

12 Claims, 8 Drawing Sheets

(52) U.S. Cl.
CPC ..... *H01L 45/126* (2013.01); *H01L 45/1233* (2013.01); *H01L 45/148* (2013.01)

(56) References Cited

U.S. PATENT DOCUMENTS

| | | | | |
|---|---|---|---|---|
| 5,912,839 | A * | 6/1999 | Ovshinsky et al. | 365/185.03 |
| 6,314,014 | B1 * | 11/2001 | Lowrey et al. | 365/100 |
| 6,778,420 | B2 * | 8/2004 | Parkinson | 365/100 |
| 6,850,432 | B2 * | 2/2005 | Lu et al. | 365/163 |
| 6,858,277 | B1 | 2/2005 | Yamada et al. | |
| 6,899,938 | B2 * | 5/2005 | Flynn | G11B 7/00454 428/64.2 |
| 7,119,353 | B2 | 10/2006 | Lankhorst et al. | |
| 7,307,267 | B2 | 12/2007 | Lankhorst et al. | |
| 2003/0214857 | A1 * | 11/2003 | Horie | G11B 7/243 365/200 |
| 2004/0001374 | A1 | 1/2004 | Tanaka et al. | |

FOREIGN PATENT DOCUMENTS

| | | | |
|---|---|---|---|
| EP | 0 495 494 | B1 | 7/1992 |
| EP | 0 499 273 | | 8/1992 |
| EP | 0 499 273 | B1 | 8/1992 |
| EP | 1 202 285 | | 5/2002 |
| EP | 1 202 285 | A2 | 5/2002 |
| EP | 1 343 154 | | 9/2003 |
| EP | 1 343 154 | A2 | 9/2003 |
| EP | 1 376 594 | A1 | 1/2004 |
| WO | WO 97/07550 | A1 | 2/1997 |
| WO | WO 00/39028 | A1 | 7/2000 |
| WO | 00/54982 | | 9/2000 |
| WO | 00/54982 | A1 | 9/2000 |
| WO | 00/57498 | A1 | 9/2000 |
| WO | WO 00/57498 | | 9/2000 |
| WO | WO 02/09206 | A1 | 1/2002 |
| WO | 03/072346 | A1 | 9/2003 |
| WO | WO 03/072346 | | 9/2003 |
| WO | 2004/032256 | A1 | 4/2004 |

OTHER PUBLICATIONS

Maimon, J., et al., "Chalcogenide-Based Non-Volatile Memory Technology," IEEE Aerospace Conference Proceedings, Big Sky, Montana, Mar. 10-17, 2001, vol. 5, pp. 2289-2294.

Njoroge, W.K. and M. Wuttig, "Cystallization Kinetics of Sputter-Deposited Amorphous AgInSbTe Films," Journal of Applied Physics 90(8):3816-3821, Oct. 2001.

Spall, E., "Ovonic Unified Memory," Ovonyx, IEEE Electron Devices Meeting, Manassas, Virginia, May 22, 2001, 48 pages.

Zhou, G.-F. and B.A.J. Jacobs, "High Performance Media for Phase Change Optical Recording," Japanese Journal of Applied Physics 38(Part 1, No. 3B)1625-1628, Mar. 1999.

International Search Report mailed Sep. 6, 2004, issued in corresponding PCT/IB2003/00548, filed Dec. 3, 2003, 5 pages.

* cited by examiner

ELECTRIC DEVICE COMPRISING PHASE CHANGE MATERIAL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*The present application is a reissue application of U.S. Pat. No. 8,779,474, which is a National Stage of International Application PCT/IB2003/005648, filed Dec. 3, 2003, which claims priority to EP Application No. 03100583.8, filed Mar. 7, 2003, and also claims priority to EP Application No. 02080430.8, filed Dec. 19, 2002, the entire contents of which are incorporated herein by reference.*

The invention relates to an electric device with a body having a resistor comprising a phase change material being changeable between a first phase and a second phase, the resistor having an electric resistance which depends on whether the phase change material is in the first phase or the second phase, the resistor being able to conduct a current for enabling a transition from the first phase to the second phase.

WO-A 00/57,498 discloses an embodiment of an electric device having a resistor comprising a phase change material, which has approximately a composition of $Sb_2Te_5Ge_2$. It maybe, e.g., $Sb_{22}Te_{56}Ge_{22}$ or $Sb_{29}Te_{57}Ge_{14}$. The phase change material is able to be in a first phase, which may be, e.g., crystalline, both of the first phase and/or the second phase may be partly amorphous and partly crystalline, provided that the resistor with the phase change material in the first phase and the resistor with the phase change material in the second phase have different values of the electric resistance.

The resistor is electrically connected to a first conductor and a second conductor such that the value of the electric resistance can be measured. The first conductor and the second conductor may comprise, e.g., one or more of the following materials: titanium, titanium nitride, titanium aluminum nitride, titanium carbon nitride, titanium silicon, molybdenum, carbon, tungsten, and titanium tungsten.

The resistor, the first conductor and the second conductor are able to conduct a current which via heating enables transitions of the phase change material between the first phase and the second phase. It is believed that for a transition from a phase with a relatively good conductivity, such as a crystalline phase or a mainly crystalline phase, to a phase with a relatively poor conductivity such as an amorphous phase or a mainly amorphous phase, use is made of heating by a sufficiently strong current causing melting of the phase change material. Hereinafter, the terms "crystalline" and "amorphous" are used to refer to a crystalline phase or a mainly crystalline phase, and to an amorphous phase or a mainly amorphous phase, respectively. Said heating may be achieved by the resistance of the first conductor, the second conductor, the resistor itself and the contact resistance between these elements. Which of these resistances contributes most to said heating depends in general on the materials and shapes of these elements. The heating ends when the current is switched off. The phase change material then cools down and assumes a more amorphous order.

When inducing a transition from a phase with a relatively low electric conductivity to a phase with a relatively high electric conductivity, said heating is initially counteracted by the poor conductivity, which limits the current conducted through the phase change material. It is believed that by applying a sufficiently high voltage, the so-called breakdown voltage, across the resistor it is possible to locally induce electrical breakdown in the phase change material, which leads to a high local current density. The corresponding heating is then sufficient to increase the temperature of the phase change material to a value above its crystallization temperature, thereby enabling the phase transition from the amorphous phase to the crystalline phase.

The known electric device can be used as a resistor with an electrically adjustable resistance. This type of device may be used in all types of circuits and integrated circuits which require a resistor with a resistance switchable between a first value and a second value.

The known electric device is particularly suited for use as an electrically writable and erasable memory cell, which carries information encrypted in the value of the electrical resistance. The memory cell is assigned, e.g., a "0" when the resistance is relatively low and a "1" when the resistance is relatively high. The resistance may be easily measured by applying a voltage across the resistor and measuring the corresponding current. The memory element can be written and erased by inducing a transition from a first phase to a second phase as described above.

It is a disadvantage of the known electric device that the switching time from the amorphous phase to the crystalline phase is relatively long. This limits the rate at which the resistor value can be set.

It is an object of the invention to provide an electric device as described in the opening paragraph which has a relatively short switching time from the amorphous phase to the crystalline phase.

The invention is defined by the independent claims. The dependent claims define advantageous embodiments.

The invention is based on the insight that the class of phase change materials used in the present invention has a different crystal growth mechanism than the known phase change materials. In the known phase change materials used for electrical devices, the phase transition from the amorphous phase to the crystalline phase takes place by nucleation, i.e. the crystallization starts from several randomly distributed points within the amorphous phase. The crystallization time in the known device is therefore independent of the volume of the amorphous phase. It is restricted by the nucleation time which is in the order of 50 ns for the known phase change materials.

In contrast to this, the electric device according to the invention comprises a phase change material which is a so-called fast growth material. In fast growth materials the crystalline phase grows at a high speed, the so-called crystallization speed, from the interface between the amorphous phase and the crystalline phase. For these materials the crystallization time depends on the volume of the amorphous phase. This allows the switching time from the amorphous phase to the crystalline phase to be relatively short, in particular when the size of the amorphous phase is relatively small, e.g. below 50 nm.

In the field of optical recording, these advantageous properties related to the phase transition between the amorphous phase and the crystalline phase of $Sb_{69}Te_{31}$ are known from the article "Phase-change media for high-numerical-aperture and-blue-wavelength recording" by H. J. Borg et al., Japanese Journal of Applied Physics, volume 40, pages 1592-1597, 2001. This article, however, does not mention that fast growth materials surprisingly have other properties which make them suitable as phase change material in the electrical device according to the invention. The inventors of the present invention have established in particular that these fast growth phase change materials are changeable between a first phase and a second phase, the resistor having an electrical resistance which depends on whether the phase change material is in the first phase or the second phase, the resistor being able to conduct a current for enabling a transition from the first phase to the second phase.

Preferably, the electric device according to the invention comprises a phase change material with a crystallization speed of at least 1 m/s. The amorphous phase change material of the known electric device has dimensions in the order of 10 to 20 nm. Applying the phase change material according to the invention in such a device results in a switching time of 10 to 20 ns or less.

In an embodiment the phase change material is a composition of formula $Sb_{1-c}M_c$, with c satisfying $0.05 \leq c \leq 0.61$, and M being one or more elements selected from the group of Ge, In, Ag, Ga, Te, Zn and Sn. Optionally, the material may comprise relatively small amounts, e.g. less than 5 atomic percent, of other elements such as, e.g. As, S, Se which do not significantly change the crystallization and the electrical breakdown behavior.

The electric device according to the invention has the additional advantage that the breakdown voltage required for switching from the high resistive amorphous state to the low resistive crystalline phase is lower than that of the known electric device. This is particularly advantageous when using advanced transistors to switch the electric device because the advanced transistors have smaller dimensions and are therefore able to provide only a relatively small voltage. The inventors have established that the breakdown voltage scales approximately with the band gap of the phase change material in the amorphous state, and that the band gap decreases with increasing Sb amount. Preferably, the phase change material comprises at least 50 atomic percent of Sb. It is further preferred that the phase change material comprises at least 10 atomic percent of one or more elements M because in this way the stability of the amorphous phase is increased and the phase change material in the amorphous phase can be subjected to relatively high temperatures before spontaneous re-crystallization occurs.

A further advantage of the electric device according to the invention resides in the fact that the resistivity of the crystalline phase is lower than that in the known electric device. Therefore, the ohmic losses in the crystalline phase are smaller than those in the known electric device, allowing the saving of power. Moreover, the contact resistance between the first conductor and the phase change material, and between the second conductor and the phase change material in the electric device according to the invention is lower than that in the known electric device. This allows one to use a smaller first contact area and/or second contact area, which for the electric device according to the invention results in a shorter switching time between the amorphous phase and the crystalline phase.

In the electric device according to the invention a smaller amount of Te is used than in the known electric device. This has the advantage that the phase change material is less reactive which improves the stability of the electric device. In particular, reactions at the interface between the phase change material and the conductors connected to it are reduced. In addition the phase change material of the electric device according to the invention has a relatively low vapor pressure due to the reduced Te amount, so that higher processing temperatures can be applied. Preferably, the phase change material is substantially free of Te.

Preferably, the one or more elements M comprise Ge and/or Ga. An electric device comprising a phase change material comprising Ge and/or Ga has the advantage that the crystallization temperature is relatively high and, therefore, the amorphous phase is stable up to relatively high temperatures. The crystallization temperature and thus the stability of the amorphous phase increases with increasing Ge and/or Ga concentration. Preferably, the phase change material comprises Ge and/or Ga in concentrations which range in total between 5 and 35 atomic percent, more preferred between 15 and 25 atomic percent. It is often preferred that the phase change material comprises less than 30 atomic percent of Ge because otherwise the crystallization temperature and the melting temperature are so high that a relatively high energy is required to induce a phase transition from the amorphous phase to the crystalline phase, and back. The crystallization speed decreases when increasing the total concentration of Ge and Ga. This dependence of the crystallization speed upon the Ge and/or Ga concentration may be used to adjust the crystallization speed.

Moreover, it is also preferred that the phase change material comprises less than 35 atomic percent of Ga because at higher Ga concentrations the difference between the electric resistance in the amorphous phase and in the crystalline phase is relatively small which may lead to errors when measuring the resistance. Preferably, the phase change material comprises less than 25 atomic percent of Ga.

In one embodiment, the phase change material comprises In and/or Sn. Preferably, the phase change material comprises In-and/or Sn in concentrations which range in total between 5 and 30 atomic percent. A phase change material comprising In and/or Sn has a relatively high crystallization speed and a relatively low melting temperature which implies that a relatively small energy is required for inducing the transition from the first phase to the second phase. It is often advantageous if the phase change material comprises in total between 15 and 25 atomic percent of In and/or Sn. Preferably, the phase change material comprises approximately 20 atomic percent of these materials.

When the phase change material comprises in total more than 20 atomic percent of Ge and/or Ga, it is preferred that the phase change material further comprises one or more elements selected from In and Sn in concentrations which are less than 30 atomic percent. The electric device according to 30 this embodiment has a relatively high stability of the amorphous phase due to the presence of Ge and/or Ga and a relatively low melting temperature due to the presence of one or more elements selected from In and Sn.

In a variation of this embodiment the phase change material is a composition of formula $Sb_aTe_bX_{100}-(a+b)$, with a, b and 100−(a+b) denoting atomic percentages satisfying $1 \leq a/b \leq 8$ and $4 \leq 100-(a+b) \leq 2$ , and X being one or more elements selected from the group of Ge, In, Ag, Ga, Zn and Sn. Adding the latter element has the advantage that the phase change material has a relatively high crystallization speed. Optionally, the material may comprise relatively small amounts, e.g. less than 5 atomic percent, of other elements such as, e.g. As, S, Se which do not significantly change the crystallization and the electrical breakdown behavior.

It is advantageous if the element X comprises Ge. An electric device comprising a phase-change material comprising Ge has the advantage that the crystallization temperature is relatively high and, therefore, the amorphous phase is stable up to relatively high temperatures.

In an embodiment the phase-change material comprises more than 10 atomic percent and less than 22 atomic percent of Ge. In this case the crystallization temperature of the phase-change material is between 180 and 250 degrees Celsius. When the crystallization temperature is lower than 180 degrees Celsius, the stability of the amorphous phase may be insufficient, in particular when the electric device may be subjected to relatively high temperatures. When the crystallization temperature is higher than 200 degrees Celsius such as, e.g. 250 degrees Celsius, a relatively high switching power is required to induce a phase transition from the amorphous phase to the crystalline phase.

It is advantageous if the first contact area is smaller than or equal to the second contact area, the first contact area having a characteristic dimension d (in nm), 6·a/b being smaller than d. This embodiment of the invention is based on the following insight: in order to be able to perform a phase transition from the crystalline phase to the amorphous phase it is required that the cooling time, i.e. the time in which the phase change material cools down to a temperature below the crystallization temperature, is smaller than the crystallization time, i.e. the time required for a transition from the amorphous phase back to the crystalline phase. If this condition is not met, the melted amorphous material re-crystallizes during cooling down, resulting in the same phase as before the heating, i.e. the phase transition from the crystalline phase to the amorphous phase is not possible.

For the phase change material of the electric device according to the invention the crystallization starts at the interface between the amorphous phase and the crystalline phase. Therefore, the crystallization time is given by the characteristic dimension of the amorphous volume divided by the crystallization speed. Here, the characteristic dimension is the largest distance between the point which is the last to crystallize and the interface between the amorphous phase and the crystalline phase at the start of the phase transition. This dimension can be approximated by the characteristic dimension of the first contact area provided that the first contact area is not larger than the second contact area.

The inventors have determined the cooling time from simulations and the crystallization speed as a function of the composition of the phase change material from experiments. Using the results of these simulations and measurements combined with the above described criterion it can be shown that 6·a/b has to be smaller than d (d is in nm) in order to prevent complete re-crystallization during cooling down of the amorphous phase.

In some cases the characteristic dimension of the amorphous phase change volume extends beyond the first contact area, the amorphous phase being approximately twice the size of the first contact area. The requirement can then be relaxed to 3·a/b being smaller than d (d is in nm). In this case a first contact area with a two times smaller surface area can be used.

In an embodiment the phase change material of the resistor is in direct contact with a crystallization layer having a crystal structure. This crystallization layer is advantageous in situations where a volume with the amorphous phase has a surface area which is in direct contact with a material different from the phase change material. When performing a phase transition from the amorphous phase to the crystalline phase, the phase change material of the electric device according to the invention starts growing from the interface between the crystalline phase and the amorphous phase. At the surface area which is in direct contact with a material being different from the-phase change material, the crystallization is therefore delayed, leading to a relatively long crystallization time. By introducing a crystallization layer having a crystal structure the crystal growth at the surface area can be expedited. Preferably, the crystal structure of the crystallization layer is similar to that of the phase change material.

It is advantageous if the crystallization layer has a thickness smaller than 100 nm. The crystallization layer is a potential heat sink, in particular due to its crystal structure. In order to limit the corresponding heat flow out of the phase change material during heating for promoting a phase transition, the crystallization layer should be relatively thin. Crystallization layers with a thickness larger than 100 nm lead to a relatively large heat flow out of the phase change material. Preferably, the thickness of the crystallization layer is smaller than 50 nm.

Preferably, the crystallization layer is in direct contact with the first contact area and/or in direct contact with the second contact area because the phase change material is often amorphous in the vicinity of the first contact area and/or the second contact area It is often advantageous if the crystallization layer is electrically conductive and electrically connects the first contact area and the second contact area. In this case the crystallization layer constitutes an electrical bypass arranged in parallel with the phase change material. The crystallization layer is then able to conduct a current which can be used to indirectly heat the phase change material for promoting the transition from the first phase to the second phase.

Preferably, a melting temperature of the crystallization layer is higher than a melting temperature of the phase change material. Preferably, the crystallization layer is chemically relatively stable to reduce the chance that the material of the crystallization layer mixes with the phase change material.

The crystallization layer is particularly advantageous if a plurality of bits are stored in one electric device. In this case the volume of the phase change material undergoing the phase transition determines which bit is stored. It is then often convenient to use a volume undergoing the phase transition which extends beyond the first contact area and/or the second contact area In particular in these cases the crystallization layer is beneficial.

In an embodiment of the electric device according to the invention the first conductor, the second conductor, the resistor and the layer constitute a memory element, and the body comprises an array of memory cells, each memory cell comprising a respective memory element and a respective selection device, and a grid of selection lines, each memory cell being individually accessible via the respective selection lines connected to the respective selection device.

Such an electric device can be used as a non-volatile, electrically writable, electrically readable and electrically erasable memory. Because each memory cell comprises a selection device, individual memory elements can be conveniently selected for reading, i.e. for measuring the value of the electrical resistance, and for writing and erasing, i.e. for inducing a transition from a first phase to a second phase.

The memory elements of the present invention may be electrically coupled to selection devices and to selection lines in order to form a memory array. The selection devices permit each discrete memory cell to be read and written without interfering with information stored in adjacent or remote memory cells of the array. Generally, the present invention is not limited to the use of any specific type of selection device. Examples of selection devices include field-effect transistors, bipolar junction transistors, and diodes such as known from, e.g., WO-A 97/07550. Examples of field-effect transistors include JFET and metal oxide semiconductor field effect transistor (MOSFET) such as known from, e.g., WO-A 00/39028. Examples of MOSFET include NMOS transistors and PMOS transistors.

Furthermore NMOS and PMOS may even be formed on the same chip for CMOS technologies.

Usually, such types of electric devices are as compact as possible which implies that the mutual distance between adjacent resistors is small. In these electric devices comprising a dielectric material according to the invention, crosstalk is reduced.

In a embodiment the selection device comprises a MOSFET having a source region, a drain region and a gate region, and the grid of selection lines comprises N first selection lines, M second selection lines, N and M being integers, and an output line, the first conductor of each memory element being electrically connected to a first region selected from the source region and the drain region of the corresponding metal oxide semiconductor field effect transistor, the second conductor of each memory element being electrically connected to the output line, a second region of the corresponding metal oxide semiconductor field effect transistor which is selected from the source region and the drain region and which is free from the first region, being electrically connected to one of the N first selection lines, the gate region being electrically connected to one of the M second selection lines.

In this type of device the resistor can be conveniently integrated with the selection device.

These and other aspects of the electric-device according to the invention will be further elucidated and described with reference to the drawings, in which:

FIG. 7 is a cross section of another embodiment of the electric device, and with reference to a few tables, in which:

Figure 1:
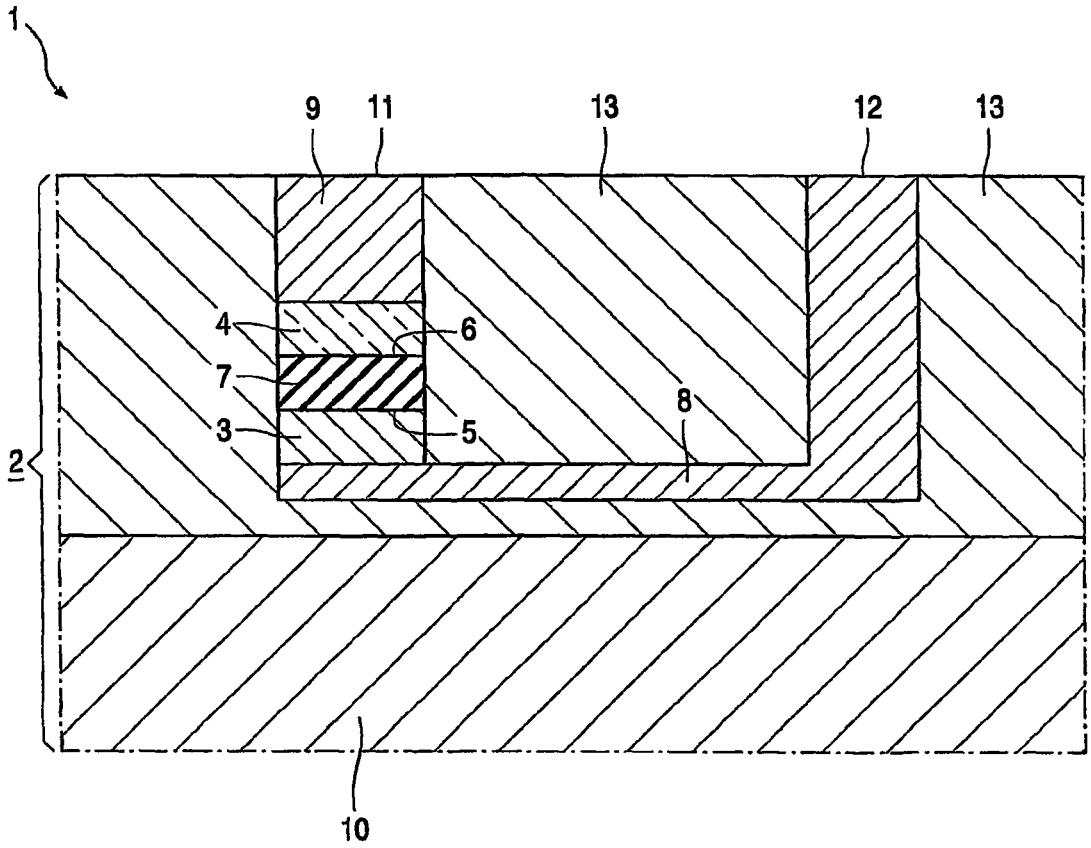
FIG. 1 is a cross section of an embodiment of the electric device.

Table 1 shows embodiments of the phase change material comprising Te used in the electric device;

Table 2 shows the crystallization temperature for various compositions;

Table 3 shows examples of the phase change material being a composition of formula $Sb_{1-c}M_c$, with c satisfying $0.05 \leq c \leq 0.61$, and M being one or more elements selected from the group of Ge, In, Ag, Ga, Te, Zn and Sn; and Table 4 shows minimum characteristic dimensions for the phase change materials of Table 1.

The Figures are not drawn to scale. In general, identical components are denoted by the same reference numerals.

The electric device 1, shown in FIG. 1, has a body 2 which comprises a substrate 10 which may comprise, e.g. a single crystal p-doped silicon semiconductor wafer. On a main surface of the substrate 10 a resistor 7 is embedded in a dielectric 13, e.g. silicon oxide. The resistor 7 comprises a phase change material changeable between a first phase and a second phase. The phase change material of the electric device 1 is a fast growth material which preferably has a crystallization speed of at least 1 m/s. In an embodiment the phase change material is a composition of formula $Sb_{1-c}M_c$, with c satisfying $0.05 \leq c \leq 0.61$, and M being one or more elements selected from the group of Ge, In, Ag, Ga, Te, Zn and Sn. Preferably, c satisfies $0.05 \leq c \leq 0.5$. Even more, preferably; c satisfies $0.10 \leq c \leq 0.5$. A group of advantageous phase change materials has one or more elements M other than Ge and Ga in concentrations which in total are smaller than 25 atomic percent and/or comprise in total less than 30 atomic percent of Ge and/or Ga. Phase change materials comprising more than 20 atomic percent of Ge and Ga and one or more elements selected from In and Sn in concentrations which in total are between 5 and 20 atomic percent have a relatively high crystallization speed and at the same time a relatively high stability of the amorphous phase.

In another embodiment the phase change material is a composition of formula $Sb_aTe_bX_{100-(a+b)}$, with a, b and 100−(a+b) denoting atomic percentages satisfying $1 \leq a/b \leq 8$ and $4 \leq 100-(a+b) \leq 22$, and X being one or more elements selected from Ge, In, Ag, Ga and Zn. The phase change material may be, e.g. $Sb_{72}Te_{20}Ge_8$, other embodiments of the above mentioned class of phase change materials will be described below. The resistor 7 has a surface with a first contact area 5 and a second contact area 6, and an electrical resistance R between these two contact areas. The electrical resistance has a first value when the phase change material is in the first phase and a second value when the phase change material is in the second phase. The phase change material may be deposited by sputtering as descried in the article "Phase-change media for high-numerical-aperture and blue-wavelength recording" by H. J. Borg et al., Japanese Journal of Applied Physics, volume 40, pages 1592-1597, 2001.

The body 2 further comprises a first conductor 3 of, e.g., titanium disilicide ($TiSi_2$) which is electrically connected to the first contact area 5, and a second conductor 4 of titanium nitride (TiN), which is electrically connected to the second contact area 6. The first conductor 3 and the second conductor 4 are connected to metal lines 8 and 9, respectively. The metal lines 8 and 9 comprise tungsten and have contact pads 12 and 11, respectively; they allow conduction of a current through the first conductor 3, the second conductor 4 and the resistor 7 for heating of the phase change material to enable a transition from the first phase to the second phase. For a good stability of the interface at the first contact area 5 and the second contact area 6 it is preferred that the phase change material is substantially free of Te.

To characterize the switching behavior of the electric device 1, a voltage U was applied between contact pads 11 and 12, and the current I flowing due to this voltage was measured. Typical results of such measurements are shown in FIGS. 2A and 2B, where the solid line and the dotted line denote the voltage U and the current I, respectively.

Figure 2A:
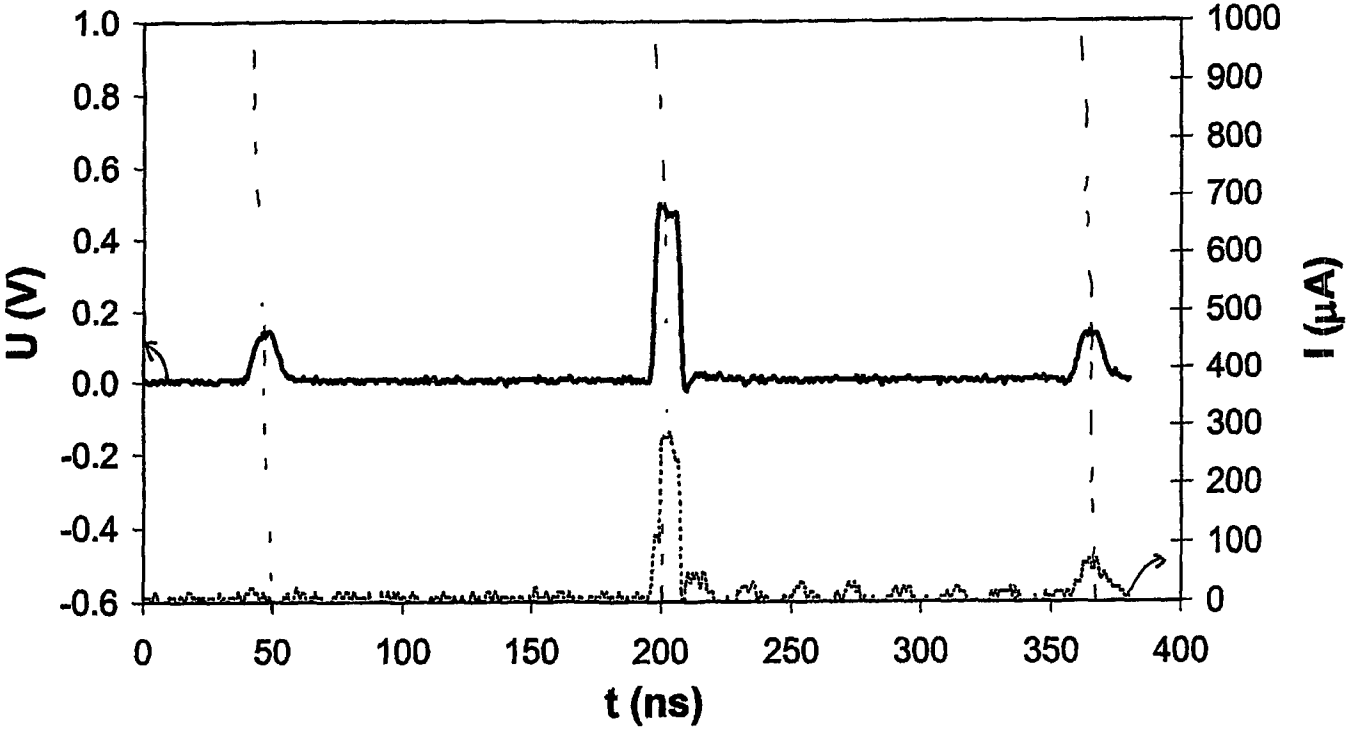
FIGS. 2A and 2B are plots of the switching from the amorphous phase to the crystalline phase, and from the crystalline phase to the amorphous phase, respectively.

For the measurement of FIG. 2A the resistor 7 was initially at t=0 in the amorphous phase. At t=50 ns a first voltage pulse of approximately 0.15 V was applied which did not lead to any significant current I during this voltage pulse. This demonstrates that the phase change material of the resistor 7 was indeed in the high resistive amorphous state. At t=200 ns a second voltage pulse of approximately 0.5 V was applied which did lead to a current I of 300 μA during this voltage pulse. Here, the supplied voltage was larger than the breakdown voltage and therefore, a significant current I is detected. At t=370 ns a third voltage pulse substantially identical to the first voltage pulse was applied which did lead to a detectable current I of approximately 80

μA. This shows that the phase change material is in a more crystalline phase with a lower resistance during the third voltage pulse. The current conducted through the resistor 7 during the second voltage pulse was sufficient to heat the phase change material for promoting the transition from the amorphous phase to the crystalline phase.

Figure 2B:
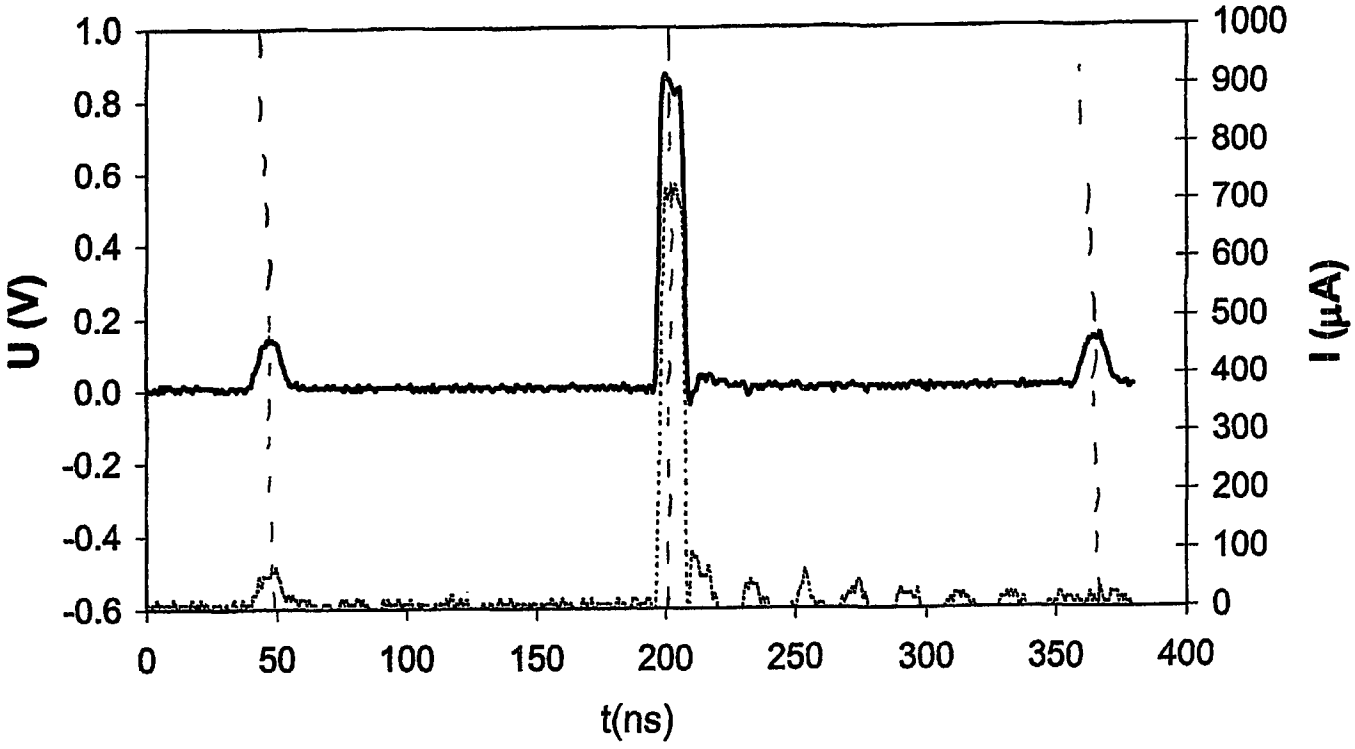

For the measurement of FIG. 2B the resistor 7 was initially at t=0 in the crystalline phase. At t=50 ns a fourth voltage pulse substantially identical to the first voltage pulse was applied which did lead to a detectable current I of approximately 80 μA. This shows that the phase change material is in a more crystalline phase with a lower resistance analogous to the situation at the third voltage pulse. At t=200 ns a fifth voltage pulse of approximately 0.8 V was applied which does lead to a current I of 700 μA during this voltage pulse. Here, the applied voltage was large enough to melt the crystalline phase and the cooling down of the melted amorphous phase took place fast enough to freeze the phase change material in an amorphous phase. As a result, a sixth voltage pulse substantially identical to the first voltage pulse provided at t=370 ns does no longer lead to a detectable current I.

The voltage pulses each had a duration of 10 ns. The results of FIGS. 2A and 2B show that the electric device 1 according to the invention can be switched from the amorphous phase to the crystalline phase, and from the crystalline phase to the amorphous phase with a switching time of at most 10 ns which is approximately a factor of 3 to 5 faster than that of the known electrical device.

Figure 3:
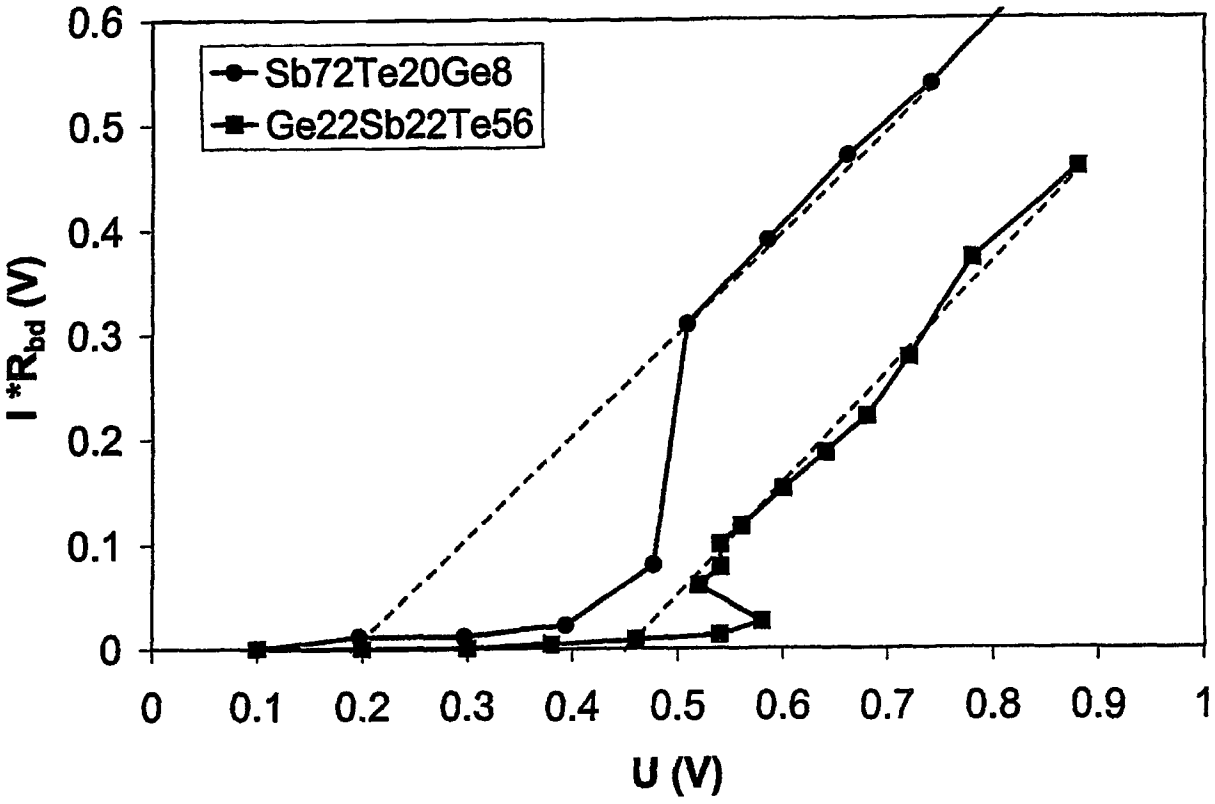
FIG. 3 is a plot of the current as a function of the applied voltage when switching from the amorphous phase to the crystalline phase.

The electrical breakdown behavior of the electric device 1 according to the invention and that of the known electric device are compared in FIG. 3. For both devices the current I is measured as a function of the applied voltage U. At the start of the measurements, the phase change material was in the amorphous phase. A voltage of 0.1 V was applied to the devices which resulted in a small current I. Subsequently the voltage was increased and for each voltage the corresponding current was measured.

In the electric device 1 according to the invention, breakdown occurred approximately at $U_{bd}$=0.45 V leading to a substantially increased current I. In the known electric device, breakdown occurred at approximately $U_{bd}$=0.6 V. A further increase of the voltage U results in a linearly increasing current I. The corresponding differential resistance for voltages U larger than the breakdown voltage $U_{bd}$ is denoted $R_{bd}$. The result shown in FIG. 3 illustrates that the electric device 1 according to the invention has a smaller breakdown voltage than the known electric device.

Figure 4:
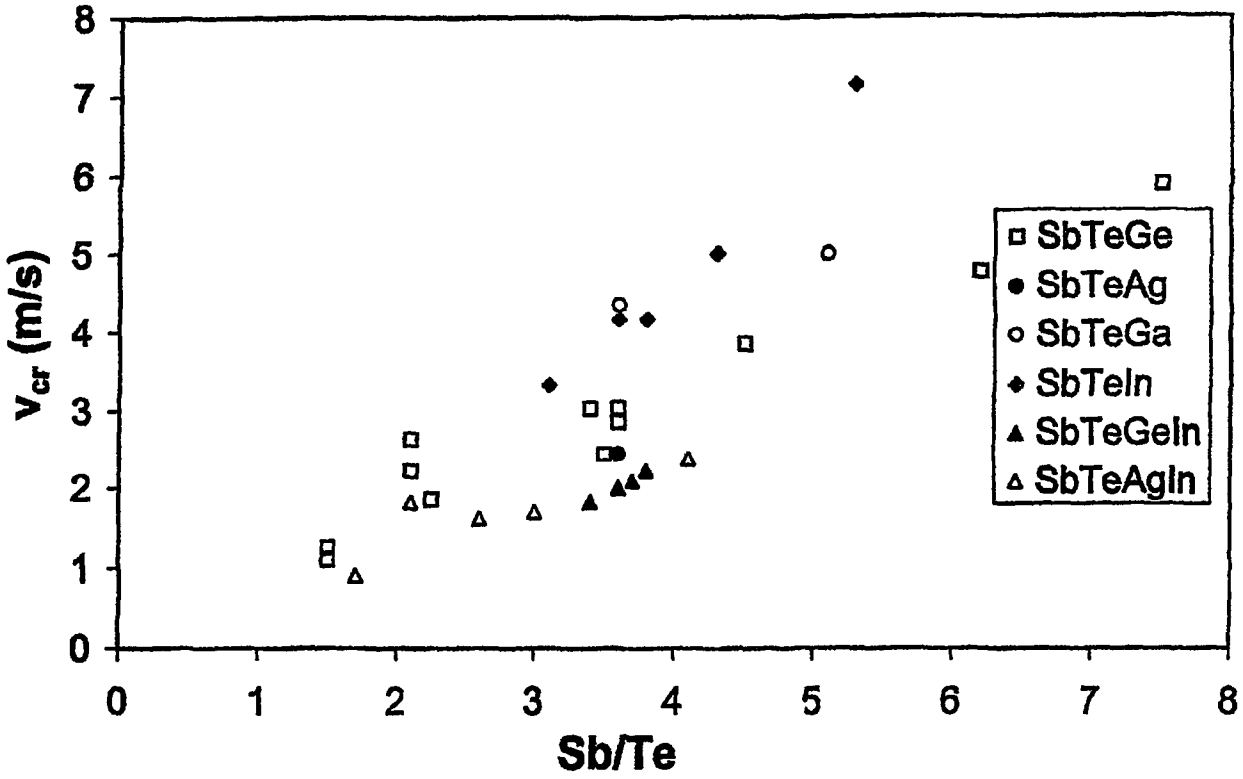
FIG. 4 is a plot of the crystallization speed as a function of the Sb/Te ratio.

When the phase change material is a composition of formula $Sb_aTe_bX_{100-(a+b)}$, with a, b and 100−(a+b) denoting atomic percentages satisfying 1≤a/b≤8 and 4≤100−(a+b)≤22, and X being one or more elements selected from Ge, In, Ag, Ga and Zn, the crystallization speed of the phase change material used in the electric device 1 can be tuned by varying the Sb/Te ratio as shown in FIG. 4. The crystallization speed is 1 m/s or higher and it increases approximately linearly if the amount of Sb is increased with respect to the amount of Te. The phase change material of the electric device 1 according to the invention comprises Sb and Te in a ratio Sb/Te larger than 1 and smaller than 8. Preferably, the ratio is smaller than 4 because for larger ratios the crystallization speed is above approximately 4.5 m/s. In many cases it is then impossible to obtain an amorphous phase because the phase change material crystallizes before it is cooled down to below the crystallization temperature. The phase change material further comprises 4 to 22 atomic percent of an element X selected from Ge, In, Ag, Ga and Zn. The element X may comprise one or more of these elements. Examples of this type of phase change material are given in Table 1. The crystallization speed of the phase change material is above 1 m/s and increases as the Sb/Te ratio increases, independent of the choice of the element X and its concentration.

TABLE 1

Examples of the phase change material being a composition of formula $Sb_aTe_bX_{100-(a+b)}$, with a, b and 100 − (a + b) denoting atomic percentages satisfying 1 ≤ a/b ≤ 8 and 4 ≤ 100 − (a + b) ≤ 22, and X being one or more elements selected from Ge, In, Ag, Ga and Zn. Ge, In, Ag and Ga denote the atomic percentage of these elements comprised in the phase change material, Sb/Te denotes the ratio of the atomic percentage of Sb and Te.

| Sb/Te | Ge | In | Ag | Zn | Ga | composition |
|---|---|---|---|---|---|---|
| 3.6 | 8 | | | | | $Sb_{72}Te_{20}Ge_8$ |
| 1.7 | 15 | | | | | $Sb_{54}Te_{31}Ge_{15}$ |
| 1.5 | 15 | | | | | $Sb_{51}Te_{34}Ge_{15}$ |
| 1.7 | 10 | | | | | $Sb_{57}Te_{33}Ge_{10}$ |
| 3.6 | | | 8 | | | $Sb_{72}Te_{20}Ag_8$ |
| 3.6 | | | | | 8 | $Sb_{72}Te_{20}Ga_8$ |
| 5.1 | | | | | 8 | $Sb_{77}Te_{15}Ga_8$ |
| 3.6 | | 8 | | | | $Sb_{72}Te_{20}In_8$ |
| 4 | | 5 | | | | $Sb_{76}Te_{19}In_5$ |
| 4 | | 10 | | | | $Sb_{72}Te_{18}In_{10}$ |
| 3.6 | 6 | | | 2 | | $Sb_{72}Te_{20}Ge_6Zn_2$ |
| 3.6 | 6 | 2 | | | | $Sb_{72}Te_{20}Ge_6In_2$ |
| 3.6 | 2 | 7 | | | | $Sb_{72}Te_{19}Ge_2In_7$ |
| 3.6 | | 4 | | | 4 | $Sb_{72}Te_{20}Ga_4In_4$ |
| 3.3 | 1 | | | | 4 | $Sb_{73}Te_{22}Ge_1Ga_4$ |
| 3.3 | 2 | | | | 3 | $Sb_{73}Te_{22}Ge_2Ga_3$ |
| 6.7 | 8 | | | | | $Sb_{80}Te_{12}Ge_8$ |
| 8 | 10 | | | | | $Sb_{80}Te_{10}Ge_{10}$ |
| 4.5 | 11 | | | | | $Sb_{73}Te_{16}Ge_{11}$ |

Figure 5:
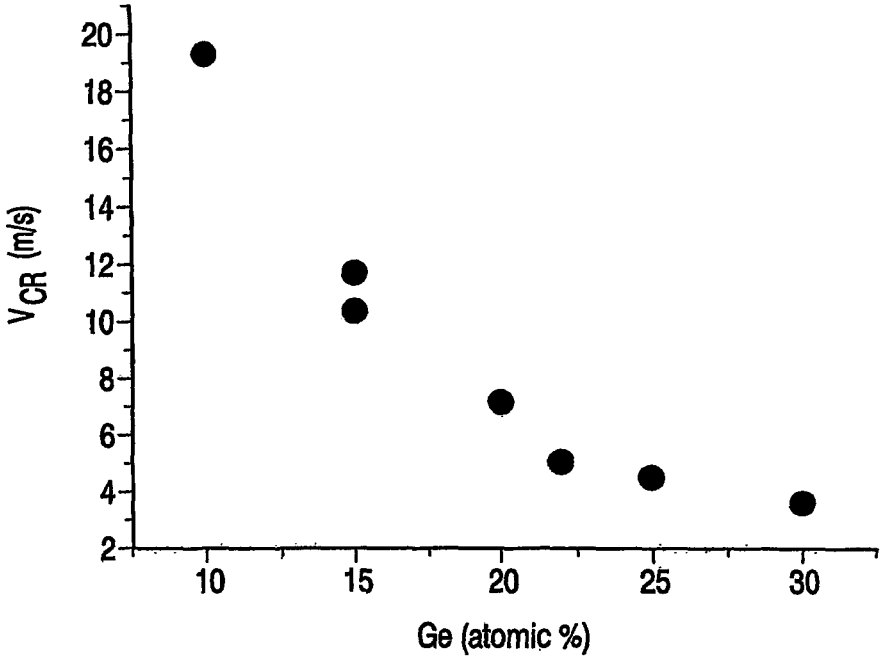
FIG. 5 is a plot of the crystallization speed as a function of the Ge content.

When the phase change material is a composition of formula $Sb_{1-c}M_c$, with c satisfying 0.05≤c≤0.61, and M comprising Ge, the crystallization speed of the phase change material used in the electric device 1 can be tuned by varying the Ge content as shown in FIG. 5.

The phase change materials being a composition of formula $Sb_{1-c}M_c$ with c satisfying 0.05≤c≤0.61, and M being one or more elements selected from the group of Ge, In, Ag, Ga, Te, Zn and Sn have crystallization temperatures, shown in Table 2, which are typically 50-100° C. higher than those of the compositions near the GeTe—$Sb_2Te_3$ tie-line.

Additional advantages of these materials are that the high crystallization temperature is relatively high and that the sheet resistance of the crystalline phase is substantially independent of the temperature for temperatures up to 400° C.

TABLE 2

Crystallization temperature for various compositions of the phase change material.

| Compound | $T_c$ (as deposited amorphous) (° C.) | $T_c$ (amorphous mark in crystalline layer) (° C.) |
|---|---|---|
| $Ga_{10}Sb_{90}$ | 210 | 165 |
| $Ga_{17}Sb_{83}$ | 233 | 210 |
| $Ga_{30}Sb_{70}$ | 251 | |
| $Ge_{12}Sb_{88}$ | 235 | 154 |
| $Ge_{15}Sb_{85}$ | 250 | 208 |
| $Ge_{22}Sb_{78}$ | 271 | 246 |
| $Ge_{30}Sb_{70}$ | 281 | |
| $Ge_5In_{20}Sb_{85}$ | 200 | 134 |

TABLE 2-continued

Crystallization temperature for various compositions of the phase change material.

| Compound | $T_c$ (as deposited amorphous) (° C.) | $T_c$ (amorphous mark in crystalline layer) (° C.) |
|---|---|---|
| $Ga_{20}In_{15}Sb_{65}$ | 215 | 190 |
| $Ge_{15}Sn_{20}Sb_{65}$ | 212 | 180 |

Figure 6A:
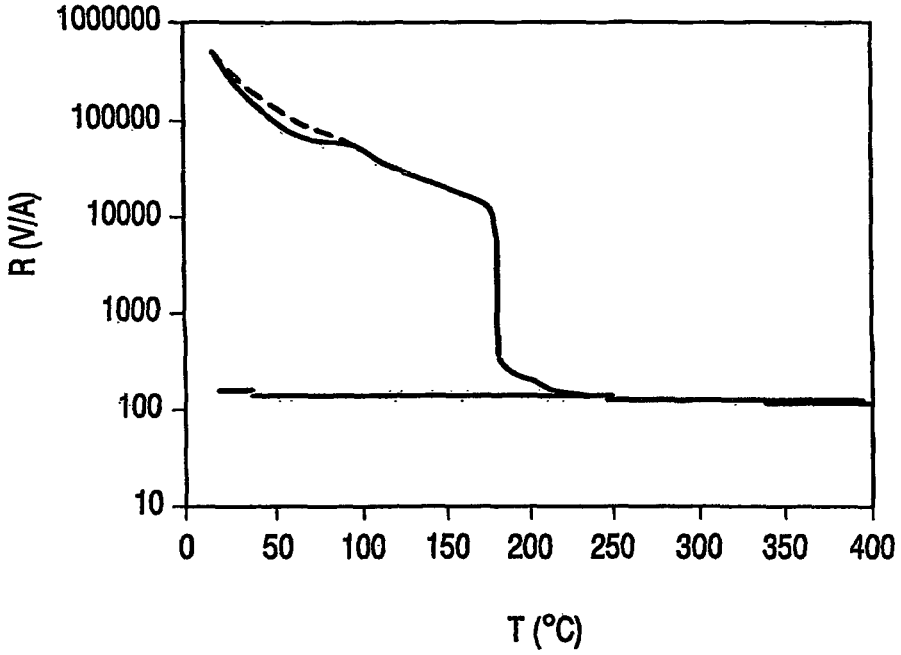
FIGS. 6A and 6B are plots of the sheet resistance R as a function of the temperature of $Sb_{85}Ga_{15}$ and $Sb_{85}Ge_{15}$, respectively.
Figure 6B:
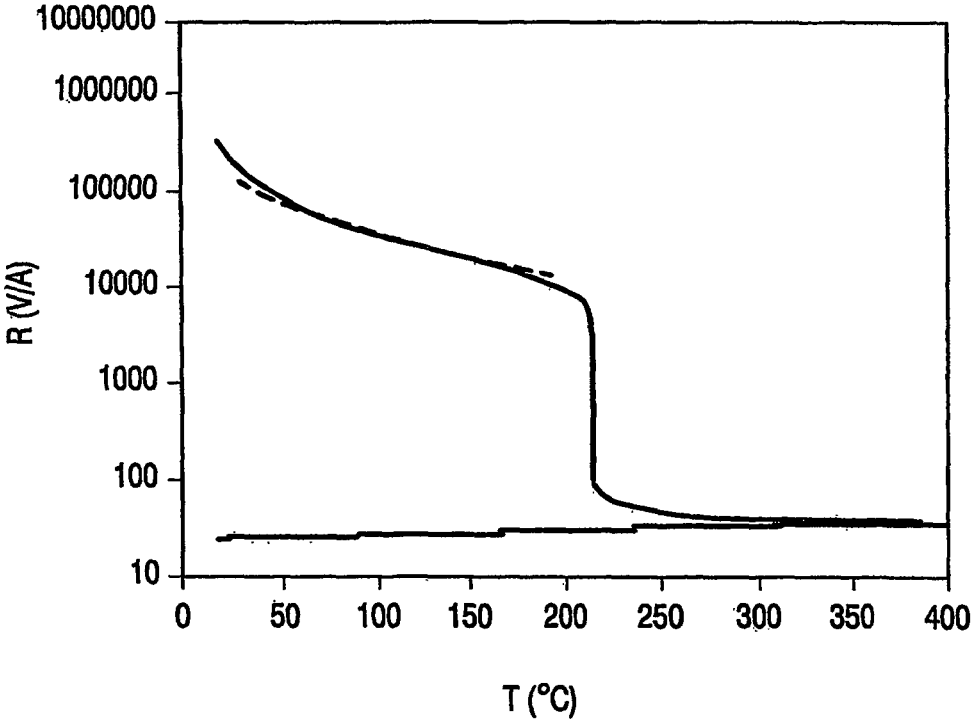

The phase change materials being a composition of formula $Sb_{1-c}M_c$, with c satisfying $0.05 \leq c \leq 0.61$, and M being one or more elements selected from the group of Ge, In, Ag, Ga, Te, Zn and Sn have a sheet resistance R shown in FIGS. 6A and 6B for $Sb_{85}Ga_{15}$ and $Sb_{85}Ge_{15}$, respectively, which changes by at least two orders of magnitude upon crystallization.

TABLE 3

Examples of the phase change material being a composition of formula $Sb_{1-c}M_c$, with c satisfying $0.05 \leq c \leq 0.61$, and M being one or more elements selected from the group of Ge, In, Ag, Ga, Zn and Sn.

| c | M | composition |
|---|---|---|
| 0.15 | Ge | $Sb_{85}Ge_{15}$ |
| 0.15 | In | $Sb_{85}In_{15}$ |
| 0.15 | Ga | $Sb_{85}Ga_{15}$ |
| 0.12 | Ge | $Sb_{88}Ge_{12}$ |
| 0.22 | Ge | $Sb_{78}Ge_{22}$ |
| 0.15 | In, Ga | $Sb_{85}In_{10}Ga_5$ |
| 0.08 | Ge | $Sb_{92}Ge_8$ |
| 0.1 | Ga | $Sb_{90}Ga_{10}$ |
| 0.15 | In, Ge | $Sb_{85}In_{10}Ge_5$ |
| 0.15 | In, Ga | $Sb_{85}In_{7.5}Ga_{7.5}$ |
| 0.2 | In | $Sb_{80}In_{20}$ |
| 0.35 | Ge, Sn | $Sb_{65}Ge_{15}Sn_{20}$ |
| 0.55 | Ge, Sn | $Sb_{45}Ge_{25}Sn_{30}$ |
| 0.3 | Ge | $Sb_{70}Ge_{30}$ |
| 0.3 | Ga | $Sb_{70}Ga_{30}$ |
| 0.5 | Ga, Sn | $Sb_{50}Ga_{25}Sn_{25}$ |
| 0.5 | In, Ge | $Sb_{51}In_{20}Ge_{29}$ |
| 0.35 | Zn, Ge, In | $Sb_{65}Ge_{20}In_{10}Zn_5$ |
| 0.35 | Ag, Ge, In | $Sb_{65}Ge_{20}In_{10}Ag_5$ |
| 0.35 | In, Ge, Sn | $Sb_{65}Ge_{20}Sn_{10}In_5$ |

Figure 7:
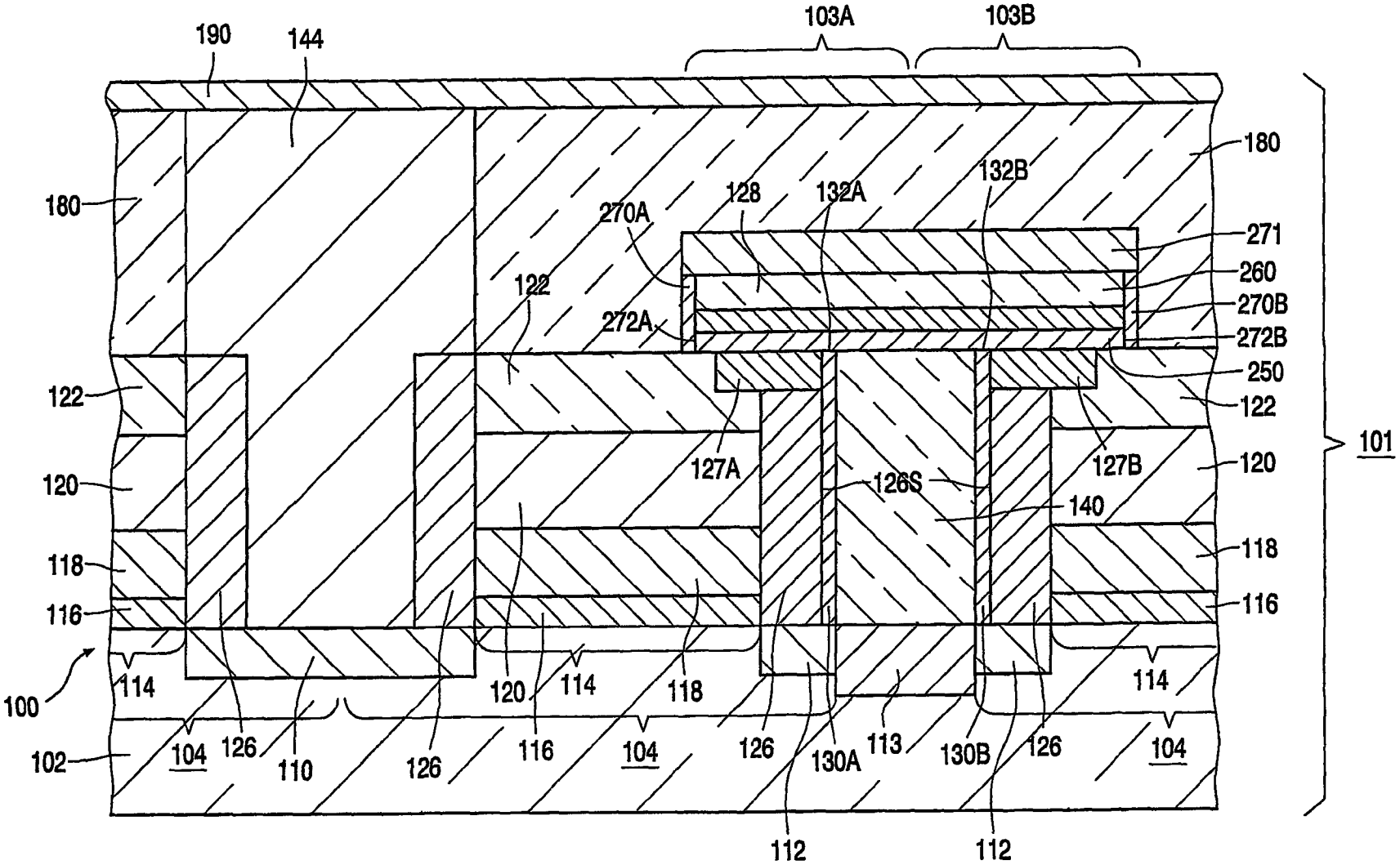

In another embodiment, shown in FIG. 7, the electric device 100 is formed in body 101 comprising a semiconductor substrate 102 analogous to substrate 10 of FIG. 1. It comprises an N×M array of memory cells which array is identical to that known from WO-A 00/57498, see in particular FIG. 4 of that patent application. Here, N and M are integers. Each memory cell comprises a respective memory element 103 and a respective selection device 104. In the embodiment shown in FIG. 7 each memory cell comprises two independent memory elements 103A and 103B. The first conductor 130A, the second conductor 270A, the resistor 250 and the layers 127A and 128 constitute memory element 103A, and the first conductor 130B, the second conductor 270B, the resistor 250 and the layers 127B and 128 constitute memory element 103B. In other words, the memory elements 103A and 103B share the same resistor 250 and the same layer 128. In another embodiment, not shown, layer 128 is omitted and layer 250 is in direct contact with layer 260. In yet another embodiment, also not shown, layer 127A and/or 127B are omitted.

The resistor 250 comprises one of the phase change materials described above. It has a surface with first contact areas 132A and 132B, and second contact areas 272A and 272B. As part of memory element 103A, the resistor 250 has an electrical resistance between the first contact area 132A and the second contact area 272A which has a first value when the phase change material is in the first phase and a second value when the phase change material is in the second phase. As part of memory element 103B, the resistor 250 has an electrical resistance between the first contact area 132B and the second contact area 272B which has a first value when the phase change material is in the first phase and a second value when the phase change material is in the second phase.

The contact areas 132A and 132B are smaller than or equal to the second contact areas 272A and 272B, respectively. The first contact areas 132A and 132B each have a characteristic dimension d. In an embodiment the atomic percentages a and b of Sb and Te, respectively, are smaller than d/3, d being in nm. For a given ratio a/b this implies that the minimum characteristic dimension of the first contact area 132 is $d_{min,1}=6 \cdot a/b$, where d is in nm. Typical values of $d_{min,1}$ for various ratios of a/b are given in Table 4.

When the amorphous volume extends beyond the first contact area, the minimum characteristic dimension of the first contact area 132 can be relaxed to approximately $d_{min,2}=3 \cdot a/b$, where d is in nm. Typical values are also shown in Table 4.

TABLE 4

Minimum characteristic dimension of an electric device 1 in which the phase change material does not extend beyond the first contact area 132 and in which it extends to approximately twice the characteristic dimension of the contact area. In the first case the minimum allowable characteristic dimension is $d_{min,1}$, in the latter it is $d_{min,2}$.

| Sb/Te | $d_{min,1}$ (nm) | $d_{min,2}$ (nm) |
|---|---|---|
| 1.5 | 9 | 4.5 |
| 1.7 | 10.2 | 5.1 |
| 3.3 | 19.8 | 9.9 |
| 3.6 | 21.6 | 10.8 |
| 4 | 24 | 12 |
| 4.5 | 27 | 13.5 |
| 5.1 | 30.6 | 15.3 |

The first conductors 130A and 130B are electrically connected to the first contact areas 132A and 132B, respectively. The second conductors 270A and 270B are electrically connected to the second contact areas 272A and 272B, respectively. The first conductor 130A, the second conductor 270A and the resistor 250 are able to conduct a current for heating of the phase change material to enable a transition from the first phase to the second phase, thereby changing the electrical resistance of the first memory element 103A. Analogously, the first conductor 130B, the second conductor 270B and the resistor 250 are able to conduct a current for heating of the phase change material to enable a transition from the first phase to the second phase, thereby changing the electrical resistance of the second memory element 103B.

As shown in the embodiment shown in FIG. 7, a layer 260 of a dielectric material provides electrical isolation between the resistor 250 and the output line 271 such that the resistor 250 is connected to the output line 271 only via the second conductors 270A and 270B. The dielectric layer 140 electrically isolates the first conductor 130A from the first conductor 130B. A-dielectric layer 180 which may comprise borophosphosilicate glass (BPSG) is deposited on top of the electric device 100.

Analogous to the electric device known from WO-A 00/57498, the first conductors 130A and 130B are conductive sidewall spacers, also referred to as conductive spacers, formed along the sidewall surfaces 126S of the dielectric regions 126. The areas of contact between the resistor 250 and the first conductors 130A and 130B are the first contact area 132A and 132B, respectively. Hence, the only electrical coupling between the resistor 250 and the first conductors 130A and 130B is through all or a portion of the first contact area 132A and 132B, respectively. The remainder of the first conductors 130A and 130B is electrically isolated from the resistor 250 by dielectric layers 126 and 140.

Alternatively, the first conductor 130A and/or 130B may be formed as conductive sidewall spacers by conformally depositing one or more contact layers onto the sidewall surface or surfaces of a via hole as known from WO-A 00/57498. The via hole may be round, square, rectangular or irregularly shaped. The conductive sidewall spacers may also be formed by conformally depositing one or more contact layers onto the sidewall surfaces of a pillar or mesa. The remaining space in the via is filled with a layer of dielectric material.

In the electric device 100, shown in FIG. 7, the phase change material of the resistor 250 is in direct contact with crystallization layers 127A, 127B and 128, each of which has a crystal structure. The crystallization layer has a crystal structure. It may be a conductor, a semiconductor or a dielectric. It may comprise, e.g., PbTe, $Ag_2Te$, CrTe Pb, Ge and Si. It has a thickness between 2 and 100 nm. The crystallization layers 127A and 127B are in direct contact with the first contact area 132A and 132B, respectively. The crystallization layer 128 is in direct contact with the second contact area 272A and 272B. The crystallization layer 127B is electrically conductive and electrically connects the first contact area 132B and the second contact area 272B. The crystallization layer 127B constitutes an electrical bypass arranged in parallel with the phase change material.

The body 101 comprises a grid of selection lines comprising N first selection lines 190, M second selection lines 120 and an output line 271 such that each memory cell is individually accessible via the respective selection lines 120 and 190 connected to the respective selection device 104. Each of the memory elements 103A and 103B of electric device 100 is electrically coupled to a selection device 104 which is a MOSFET, and more specifically an NMOS transistor. The MOSFET has n-doped source regions 110, n-doped drain regions 112, and gate regions 118. The source regions 110 and the drain regions 112 may comprise more than one portion of n-doped material, namely a lightly doped n-portion and a more heavily doped n+ portion.

The n-doped source regions 110 and drain regions 112 are separated by channel regions 114. The gate regions 118, formed above the channel regions 114, control the flow of current from the source regions 110 to the drain regions 112 through the channel regions 114. The gate regions 118, preferably comprise a layer of polysilicon. The gate regions 118 are separated from the channel regions 114 by dielectric regions 116.

Channel stop regions 113 are formed in the n-doped drain regions 112 creating two neighboring, electrically isolated drain regions 112 for separate NMOS transistors. Generally, the channel stop regions 113 have a conductivity type opposite to that of the source and drain regions 110, 112. In the NMOS embodiment shown, the channel stop regions 113 comprises p-doped silicon.

Formed above the gate regions 118 are selection lines 120 which preferably comprise a layer of tungsten silicide. Selection lines 120 are used to deliver the electrical signal to the gate regions 118. Formed above the selection lines 120 are the dielectric regions 122 which electrically insulate the selection lines 120 from neighboring regions of the electric device 100. The stacks of layers 116, 118, 120 are collectively referred to as the gate stacks. Dielectric regions 126 are formed on the sidewall surfaces of the gate stacks.

Selection lines 190 are formed on top of the upper insulation regions 180. The selection lines 190 may be formed from a conductive material such as aluminum or copper. Tungsten plugs 144 electrically connect the selection lines 190 to the drain regions 110. It is noted that in the particular embodiment shown in FIG. 2, two NMOS transistors share each of the tungsten plugs 144. A layer of titanium silicide (not shown) may be formed on the surface of the silicon substrate to improve the conductivity between the substrate 102 and the conductive sidewall spacers 130A and 130B as well as between the substrate 102 and the conductive plugs 144. The conductive plugs 144 are electrically insulated from the gate stacks by dielectric layers 126.

The first conductors 130A and 130B of memory element 103A and 103B, respectively, are electrically connected to a first region selected from the source region 110 and the drain region 112 of the corresponding metal oxide semiconductor field effect transistor. In the embodiment of FIG. 2 the first region is the drain region 112. The second conductor 270 of each memory element 103A and 103B is electrically connected to the output line 271, which may comprise, e.g., the same material as the second conductor 270. A second region of the corresponding metal oxide semiconductor field effect transistor which is selected from the source region 110 and the drain region 112 and which is not in contact with the first region, is electrically connected to one of the N first selection lines 190. The gate region 116 is electrically connected to one of the M second selection lines 120.

In an alternative embodiment, the electric device has a structure as shown in any of the Figures of WO-A1-02/09206 or as disclosed in the description of WO-A1-02/09206.

The electric device according to the invention is advantageously used in an electric apparatus such as, e.g. a computer, a television receiver or a mobile phone, comprising a processor for, e.g. data processing, to which processor a memory is coupled for storing information. The electric apparatus further comprises a display coupled to an output terminal.

In summary, the electric device 1, 100 has a body 2, 101 with a resistor 7, 250 comprising a phase change material being changeable between a first phase and a second phase. The resistor 7, 250 has an electrical resistance which depends on whether the phase change material is in the first phase or the second phase. The resistor 7, 250 is able to conduct a current for enabling a transition from the first phase to the second phase. The phase change material is a fast growth material which may be a composition of formula $Sb_{1-c}M_c$, with c satisfying $0.05 \leq c \leq 0.61$, and M being one or more elements selected from the group of Ge, In, Ag, Ga, Te, Zn and Sn, or a composition of formula $Sb_aTe_bX_{100-(a+b)}$, with a, b and 100−(a+b) denoting atomic percentages satisfying $1 \leq a/b \leq 8$ and $4 \leq 100-(a+b) \leq 2$, and X being one or more elements selected from Ge, In, Ag, Ga and Zn.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a," or "an" preceding an element does not exclude the presence of a plurality of such elements.

The invention claimed is:

1. An electric device with a body having a resistor comprising a phase change material being changeable between a first phase and a second phase via crystallization initiating at an interface between crystalline and amorphous materials, the resistor having an electric resistance which depends on whether the phase change material is in the first phase or the second phase, the resistor being able to conduct a current for enabling a transition from the first phase to the second phase, the phase change material being a fast growth material, wherein the phase change material is a composition of formula $Sb_{1-c}$[,]$M_c$, with c satisfying $0.05 \leq c \leq 0.61$, [and] M being one or more elements selected from the group *consisting* of Ge, In, Ag, Ga, [Te,] *and* Zn[and Sn], wherein the phase change material comprises In [or Sn] in concentrations which range in total between 5 and 30 atomic percent*, and wherein the phase change material is substantially free of Te.*

*2. An electric device comprising:*

*a crystallization layer; and*

*a resistor including a fast-growth phase change material on the crystallization layer that is changeable from an amorphous phase to a crystalline phase in response to an electrical pulse, wherein crystallization of the phase change material is configured to initiate at an interface with the crystallization layer, wherein the phase change material does not include Sn, wherein the phase change material comprises In in concentrations between 5 and 30 atomic percent, and wherein the phase change material is substantially free of Te.*

*3. The electric device of claim 2, wherein a first phase is an amorphous phase having a first electrical resistance, and a second phase is a crystalline phase having a second electrical resistance and wherein a second resistance is smaller than the first resistance.*

*4. The electric device of claim 2, wherein the phase change material is a fast-growth material having a composition of formula* $Sb_{1-c}M_c$*, with c satisfying* $0.05 \leq c \leq 0.61$*, and M being one or more elements selected from the group consisting of Ge, In, Ag, Ga, and Zn.*

*5. The device of claim 4, wherein the phase change material is configured to change from an amorphous phase to a crystalline phase in response to an electrical pulse of approximately 0.5 V.*

*6. The device of claim 4, wherein the phase change material is configured to be responsive to an electrical pulse by crystallizing without nucleation.*

*7. The device of claim 4, wherein the phase change material is configured to crystallize at a rate of at least 1 m/s in response to an electrical pulse.*

*8. The device of claim 4, wherein the phase change material is configured to be responsive to an electrical pulse by crystallizing to change the electrical resistance of the resistor in less than 20 nanoseconds.*

*9. An electric device with a body having a resistor, comprising:*

*a fast-growth phase change material that is changeable between a first phase and a second phase by crystallization that initiates at an interface between crystalline and amorphous materials, wherein the resistor has an electrical resistance which depends on whether the phase change material is in the first phase or the second phase, wherein the resistor is configured to conduct a current for enabling a transition from the first phase to the second phase, wherein the phase change material is a composition of formula* $Sb_{1-c}M_c$*, with M being one or more elements selected from the group consisting of Ge, In, Ag, Ga, and Zn, wherein the phase change material comprises In in concentrations ranging between 5 and 30 atomic percent, and wherein the phase change material is substantially free of Te.*

*10. The electric device of claim 9, wherein c satisfies* $0.05 \leq c \leq 0.5$.

*11. The electric device of claim 9, wherein c satisfies* $0.10 \leq c \leq 0.5$.

*12. The electric device of claim 9, wherein the first phase is an amorphous phase having a first electrical resistance, and the second phase is a crystalline phase having a second electrical resistance, and wherein the second resistance is smaller than the first resistance.*

* * * * *